United States Patent
Dressler et al.

(10) Patent No.: US 9,965,012 B2
(45) Date of Patent: May 8, 2018

(54) MULTI-ELEMENT MEMORY DEVICE WITH POWER CONTROL FOR INDIVIDUAL ELEMENTS

(71) Applicant: Rambus Inc., Sunnyvale, CA (US)

(72) Inventors: Deborah Lindsey Dressler, Newark, CA (US); Julia Kelly Cline, San Francisco, CA (US); Wayne Frederick Ellis, Saratoga, CA (US)

(73) Assignee: RAMBUS INC., Sunnyvale, CA (US)

( * ) Notice: Subject to any disclaimer, the term of this patent is extended or adjusted under 35 U.S.C. 154(b) by 54 days.

(21) Appl. No.: 15/017,395

(22) Filed: Feb. 5, 2016

(65) Prior Publication Data

US 2016/0231795 A1 Aug. 11, 2016

Related U.S. Application Data (63) Continuation of application No. 14/127,886, filed as application No. PCT/US2012/042075 on Jun. 12, 2012, now Pat. No. 9,256,279.

(Continued)

(51) Int. Cl.
*G06F 1/32* (2006.01)
*G11C 5/14* (2006.01)
(Continued)

(52) U.S. Cl.
CPC .............. *G06F 1/28* (2013.01); *G06F 1/3275* (2013.01); *G06F 1/3287* (2013.01); *G06F 13/4273* (2013.01); *G11C 5/063* (2013.01)

(58) Field of Classification Search
CPC ........ G06F 1/28; G06F 1/3275; G06F 1/3287; G06F 13/4273; G11C 5/063
See application file for complete search history.

(56) References Cited

U.S. PATENT DOCUMENTS 6,078,540 A 6/2000 Keeth
6,079,024 A 6/2000 Hadjimohammadi et al.
(Continued)

FOREIGN PATENT DOCUMENTS

JP 2003-109395 A 4/2003
KR 10-0715525 B1 5/2007

OTHER PUBLICATIONS

International Search Report and Written Opinion dated Feb. 21, 2013 in International Application No. PCT/US2012/042075. 13 pages.

(Continued)

*Primary Examiner* — Mark Connolly
(74) *Attorney, Agent, or Firm* — Morgan, Lewis & Bockius LLP (57) ABSTRACT

A multi-element device includes a plurality of memory elements, each of which includes a memory array, access circuitry to control access to the memory array, and power control circuitry. The power control circuitry, which includes one or more control registers for storing first and second control values, controls distribution of power to the access circuitry in accordance with the first control value, and controls distribution of power to the memory array in accordance with the second control value. Each memory element also includes sideband circuitry for enabling a host system to set at least the first control value and the second control value in the one or more control registers.

17 Claims, 6 Drawing Sheets

Related U.S. Application Data

(60) Provisional application No. 61/502,495, filed on Jun. 29, 2011.

(51) Int. Cl.
 *G06F 1/28* (2006.01)
 *G11C 5/06* (2006.01)
 *G06F 13/42* (2006.01)

(56) References Cited

U.S. PATENT DOCUMENTS

| | | |
|---|---|---|
| 7,599,205 B2 | 10/2009 | Rajan |
| 2004/0233772 A1 | 11/2004 | Kudo |
| 2007/0165461 A1 | 7/2007 | Cornwell et al. |
| 2008/0091965 A1* | 4/2008 | Nychka ............... G06F 1/3203 713/323 |
| 2008/0150088 A1* | 6/2008 | Reed .................. H01L 25/0652 257/621 |
| 2010/0109761 A1 | 5/2010 | Akiyama et al. |
| 2010/0188922 A1 | 7/2010 | Nakaoka |
| 2010/0191999 A1 | 7/2010 | Jeddeloh |
| 2011/0141838 A1 | 6/2011 | Kishibe |
| 2013/0203463 A1 | 8/2013 | Kent et al. |

OTHER PUBLICATIONS

PCT International Preliminary Report on Patentability dated Jan. 16, 2014 (Chapter I) for International Application No. PCT/US2012/042075. 9 pages.

* cited by examiner

MULTI-ELEMENT MEMORY DEVICE WITH POWER CONTROL FOR INDIVIDUAL ELEMENTS

RELATED APPLICATIONS

This Application is a continuation of U.S. patent application Ser. No. 14/127,886, filed Dec. 19, 2013, which was a U.S. National Stage Application filed under 35 U.S.C. § 371 of PCT Patent Application Serial No. PCT/US2012/042075 filed on Jun. 12, 2012, which claims the benefit of and priority to U.S. Provisional Application No. 61/502,495 filed on Jun. 29, 2011, all of which are hereby incorporated by reference in their entireties.

TECHNICAL FIELD

The disclosed embodiments relate generally to a multi-element device that includes multiple memory elements (e.g., multiple memory arrays) and more specifically to power management of individual memory elements in a multi-element device.

BACKGROUND

Multiple element devices, sometimes called multi-element devices, typically have a stack of elements interconnected by ball grid arrays, silicon through vias, or other connection mechanisms. A power mode of each memory element in a multi-element device may be controlled by an element-specific control signal. A fault in any of the connections that carry the control signals from a host device to the multi-element device can result in a loss of control of the affected memory element.

BRIEF DESCRIPTION OF THE DRAWINGS

Like reference numerals refer to corresponding parts throughout the figures.

DESCRIPTION OF EMBODIMENTS

A multi-element device includes a plurality of memory elements, each of which includes a memory array, access circuitry to control access to the memory array, and power control circuitry. The power control circuitry, which includes one or more control registers storing a first control value and a second control value, controls distribution of power to the access circuitry in accordance with the first control value, and controls distribution of power to the memory array in accordance with the second control value. Each memory element also includes sideband circuitry for enabling a host system to set at least the first control value and the second control value in the one or more control registers.

A method for controlling a multi-element device having a plurality of memory element, includes, in a respective memory element of the multi-element device, receiving, from a host system, a first control value and a second control value. The respective memory element stores, in one or more control registers, the first and second control values. The respective memory element furthermore controls distribution of power to access circuitry, for accessing a memory array of the respective memory element, in accordance with the first control value stored in the one or more control registers, and controls distribution of power to the memory array of the respective memory element in accordance with the second control value stored in the one or more control registers.

Memory element components and power control arrangements are described herein. Reference will be made to certain embodiments, which are illustrated in the accompanying drawings. While particular embodiments are described, it will be understood that it is not intended to limit the claims to these particular embodiments. The specification and drawings are, accordingly, to be regarded in an illustrative rather than a restrictive sense.

Although the terms first, second, etc. may be used herein to describe various elements, these elements should not be limited by these terms. These terms are only used to distinguish one element from another. For example, a first control value could be termed a second control value, and, similarly, a second control value could be termed a first control value, so long as all occurrences of the first control value are renamed consistently and all occurrences of the second control value are renamed consistently. The first control value and the second control value are both control values, but they are not the same control value.

The terminology used in the description of the embodiments herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, operations, elements, and/or components, but do not preclude the presence or addition of one or more other features, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Figure 1A:
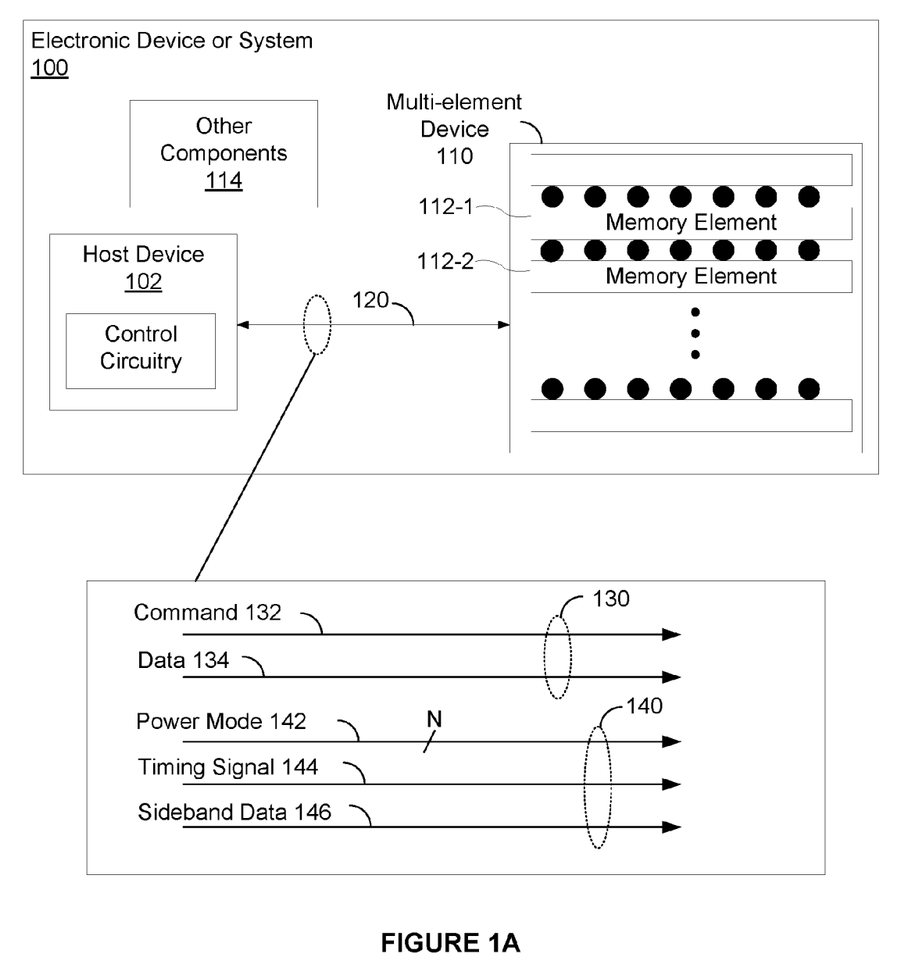
FIG. 1A is a block diagram illustrating a system including a host device, a multi-element device and a communications bus for communications between the host and the multi-element device.

FIG. 1A illustrates an electronic device or system 100 according to some embodiments. The device or system 100 includes a host device 102 coupled to a multi-element device 110 by a communication bus 120 enabling communication between multi-element device 110 and host device 102. The term element, as used herein with respect to the multi-element device, may refer to an individual die, one core of a plurality of cores on a die, or a core of an integrated chip, depending on the context. Therefore, multi-element device 110 may refer to a device with a plurality of die, a device with a plurality of die that each have one or more cores, or a device comprising a single integrated chip. Electronic device or system 100 may be any electronic device or system which contains memory. For example, electronic device or system 100 may be a personal computer, a smart phone or an embedded system. Host device 102, sometimes herein called a host system, is typically a memory controller or a processor (e.g., CPU) for executing programs stored in memory of the device of system 100. In some embodiments, host device 102 is external to the multi-element device (illustrated in FIG. 1A), while in other embodiments (illustrated in FIG. 1B), host device 102 is included in multi-element device 110 as one of the elements of multi-element device 110, in which case communication bus 120 is internal to multi-element device 110. FIG. 1C illustrates embodiments in which multiple embedded memory cores are included with a host controller core on the same die (e.g., an application specific integrated circuit, sometimes called an ASIC).

In some embodiments, multi-element device 110 includes a plurality of memory elements 112, and optionally includes other elements (e.g., memory controller, one or more processors (CPUs), etc.). In some embodiments, the multiple elements of multi-element device 110 are arranged in a stack (e.g., package on package, chip on chip, or wafer on wafer) and interconnected by ball grid arrays, silicon through vias, or other connection mechanisms. Furthermore, in some embodiments, electronic device or system 100 includes additional components 114, such as one or more user interface components (e.g., a display, user input devices, etc.), communications interfaces, power supply components, etc.

As shown in FIG. 1A, communication bus 120 includes multiple signal lines including one or more command lines 132 and one or more data lines 134 that comprise a command and data bus 130. For example, in some embodiments, the command and data bus 130 is a single "multi-drop" bus, in which case the same command line(s) 132 and data line(s) 134 are coupled to each of the memory elements 112. In some other embodiments, the command and data bus 130 includes multiple "point-to-point" command and data busses, each of which couples a respective memory element 112 to host device 102; in these embodiments, each command and data bus is a separate set of command line(s) 132 and data line(s) 134 coupled to different memory element 112 than the other command and data busses. In some embodiments, data lines 134 and sideband data lines 146 are bi-directional and allow data to be sent both from host device 102 to multi-element device 110 and also from multi-element device 110 to host device 102.

In some embodiments, communication bus 120 also includes multiple power mode signal lines 142, one or more timing signal lines 144 and one or more sideband data lines 146 that comprise a sideband bus 140, distinct from the command and data bus 130. In one embodiment, sideband bus 140 includes a separate power mode signal line for each memory elements 112, each power mode signal line delivering a memory element-specific power mode signal to a respective memory element 112 from host device 102. Furthermore, in some embodiments, the sideband bus 140 is a single "multi-drop" bus, in which case the same timing signal line(s) 144 and sideband data line(s) 146 are coupled to each of the memory element 112. In some other embodiments, the sideband bus 140 includes multiple "point-to-point" timing and sideband data busses, in which case a separate set of timing line(s) 144 and sideband data line(s) 146 is coupled to each of the memory element 112. In some embodiments (not shown), functions of power mode signal lines 142, timing signal lines 144 and sideband data lines 146 are multiplexed onto a portion of the command and data bus 130.

It is noted that in some embodiments both command and data bus 130 and sideband bus 140 are multi-drop, in some other embodiments both are point-to-point, and in yet other embodiments one if multi-drop while the other is point-to-point.

Similarly, in some embodiments, power mode signal line 142 is multi-drop, coupled to more than one memory element 112. Optionally, a single power mode signal is coupled to all the memory elements 112, with individual control being provided through use of one or more timing signals on timing signal line(s) 144 or element selection values on sideband data lines 146. In some embodiments, when a single power mode signal is coupled to all memory elements 112, host device 102 includes logic circuitry to enable individual control of the power mode signal for specific memory elements in multi-element device 110. In one example, logic circuitry in host device 102 determines an element selection value to be sent concurrently with the power mode signal to identify which individual memory element 112 is to be controlled. Alternatively, logic circuitry may use the timing signal to enable control of individual memory elements by assigning specific time slots to individual memory elements and controlling individual memory elements during their assigned time slots.

Figure 1B:
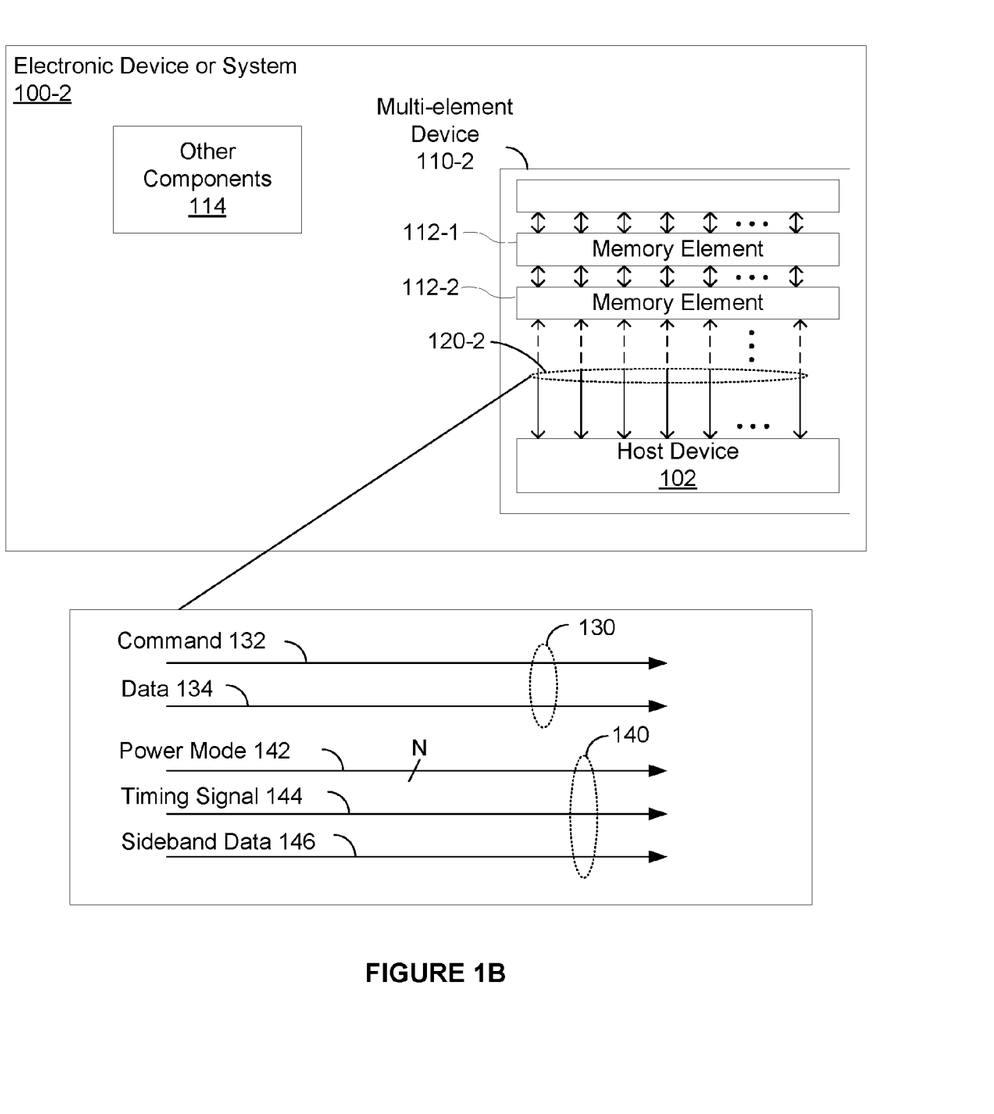
FIG. 1B is a block diagram of a multi-element device that includes a host device.
Figure 1C:
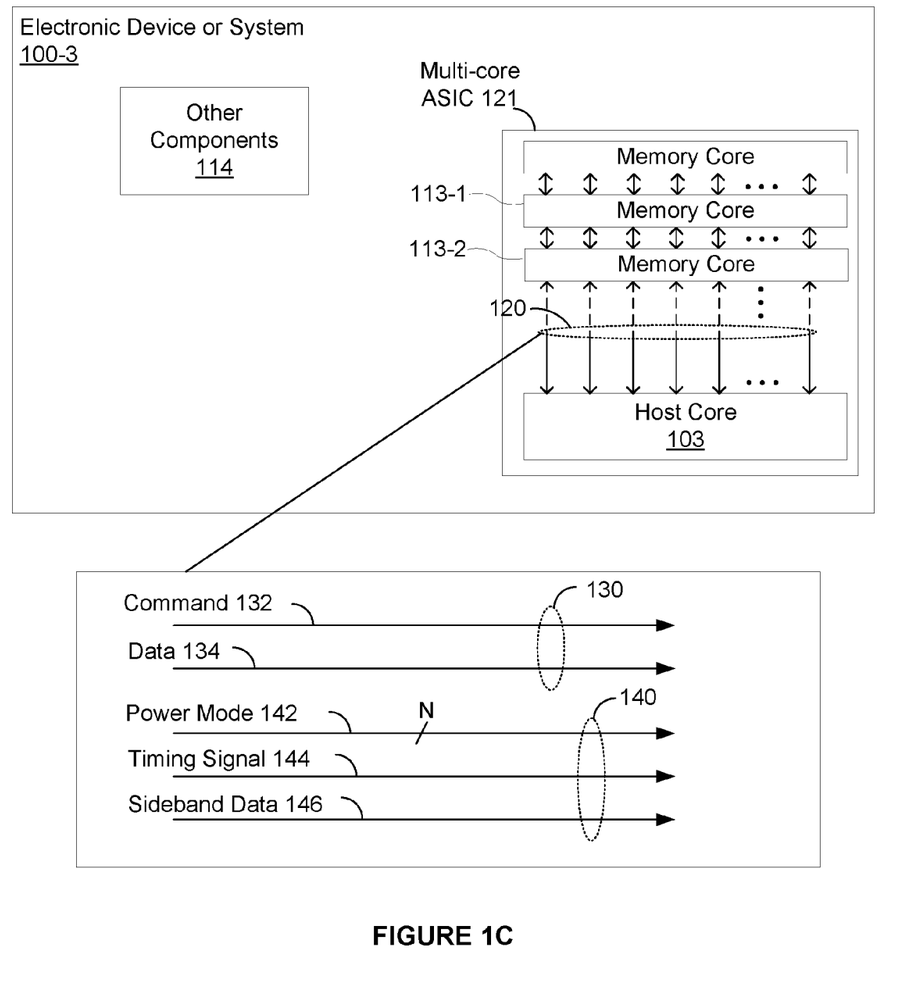
FIG. 1C is a block diagram of a single integrated circuit device having multiple memory elements and a host element interconnected within the single integrated circuit device.

FIG. 1B is a block diagram of a multi-element device 110-2 which includes a host device 102-2 as one of the elements in the multi-element device 110. The elements in multi-element array 110 are individual die, or cores on one or more die. Communications bus 120-2 is internal to multi-element device 110-2.

FIG. 1C is a block diagram of an electronic device or system 100-3 which includes a multi-core application specific integrated circuit (ASIC) 121. Multi-core ASIC 121 comprises a single integrated circuit device having multiple memory elements (memory core) 113-1-113-n and a host element (host core) 103 interconnected within the single integrated circuit device 121. The individual elements are specific cores on the single ASIC 121. Communications bus 120 is internal to multi-core ASIC 121.

Figure 2A:
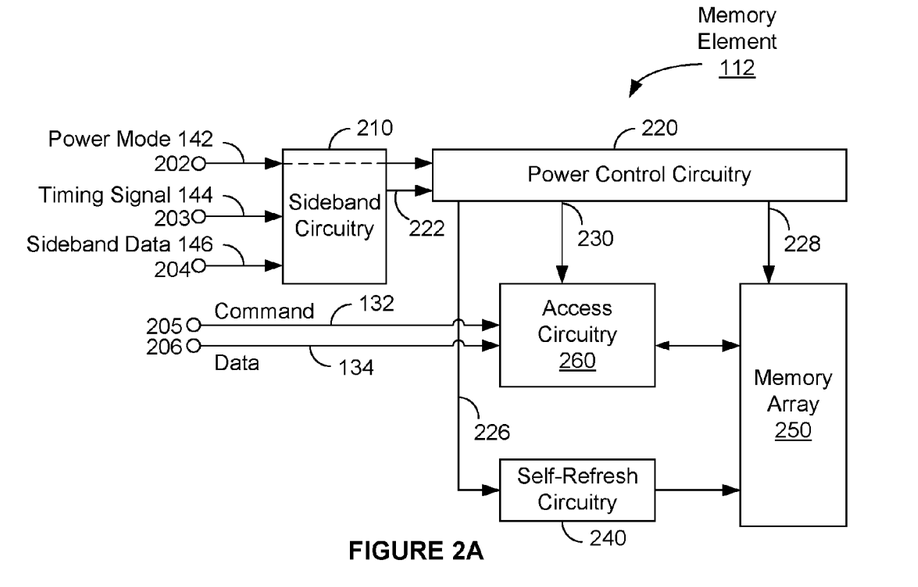
FIG. 2A is a block diagram of a memory element in a multi-element device, in accordance with some embodiments.

As shown in FIG. 2A, a respective memory element 112 of multi-element device 110 (FIG. 1) includes sideband circuitry 210, power control circuitry 220, access circuitry 260, self-refresh circuitry 240 and a memory array 250. Access circuitry 260, when powered on, enables access to memory array 250 (e.g., reading data values from and writing data values to memory array 250). Self-refresh circuit 240, when powered on, performs refresh operations on memory array 250 so as to maintain data stored in memory array 250.

Memory element 112 also includes terminals 202-204 for connecting to sideband signal lines 140, which include power mode signal line 142, timing signal line 144 and sideband data line 146. Furthermore, in some embodiments, memory element 212 includes terminals 205-206 for connecting to command lines 132 and data lines 134.

In some embodiments, the sideband terminals 202-204 are included in the sideband circuitry 210 and the command and data terminals 205-206 are included in access circuitry 260. While FIG. 2A depicts terminals 202-204 and 205-206 as included in the sideband circuitry 210 and access circuitry 260 respectively, other configurations, arrangements and connections are possible. Furthermore, in some embodiments power control circuitry 220 is coupled to, and provides power to, access circuitry 260, self-refresh circuitry 240 and memory array 250. According to some embodiments access circuitry 260 and self-refresh circuitry are configured to connect to the memory array 250.

In some embodiments, the sideband terminals of a respective memory element 112 are coupled to the sideband terminals of another memory element 112 of the multi-element device 110. In some embodiments, the power mode terminal 101 of a respective memory element 112 is coupled to the power mode terminal 202 of another memory element 112 of the multi-element device 110 (e.g., in a daisy chain or multi-drop configuration).

Figure 2B:
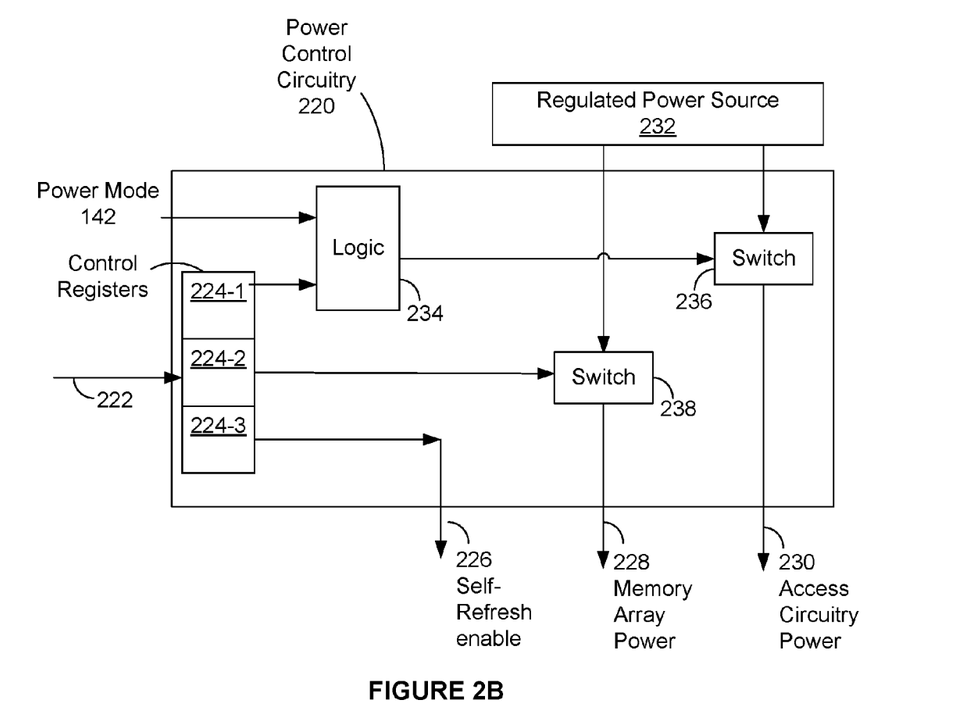
FIG. 2B is a block diagram of power control circuitry in a memory element of a multi-element device, in accordance with some embodiments.

As shown in FIG. 2B, in some embodiments the power control circuitry 220 includes one or more control registers 224-1 to 224-3, a power mode signal line 142, a self-refresh enable control line 226, a memory array power line 228, and an access circuitry power line 230. In some embodiments, power control circuitry 220 allows host device 102 to disable power to an element (e.g., a defective element, an element not in use, etc.) within multi-element device 110. In accordance with the power mode signal and the values stored in control registers 224, power control circuitry 220 can disable power to access circuitry 260 of the memory element and/or to a memory array 250 thereof, as described in more detail below. According to some embodiments control registers 224 store first and second control values. According to some embodiments, the first and second control values are received from the sideband circuitry 210 through signal lines 222. Furthermore, in some implementations, power control circuitry 220 includes logic 234, and switches 236 and 238, as discussed below.

According to some embodiments the power control circuitry 220 controls power to access circuitry 260 (FIG. 2A) in accordance with the first control value stored in control registers 224. Power control circuitry 220 controls power to memory array 250 in accordance with the second control value stored in control registers 224. According to some embodiments, control registers 224 store a third control value (received from host 102) and power control circuitry 220 controls operation of self-refresh circuitry 240 (FIG. 2A) in accordance with the third control value. It should be noted that in some embodiments control registers 224 for a respective memory element 112 are located in memory element 112, but not in power control circuitry 220. For example, in some embodiments the control registers 224 are included in sideband circuitry 210, or in memory array 250, or are positioned near memory array 250 or near regulated power source 232. Further, in some embodiments, control registers 224 are not co-located with respect to each other.

According to some embodiments, power control circuitry 220 controls provision of power to the access circuitry 260 via access circuitry power line 230. Power control circuitry 220 provides power from a regulated power source 232 to access circuitry 260 in accordance with a power mode signal, conveyed by power mode signal line 142, when the first control value is equal to a first predefined default value. Power control circuitry 220 disables the provision of power from regulated power source 232 to access circuitry 260 when the first control value is equal to a first predefined power down value. The first predefined power down value is distinct from the first predefined default value.

In one implementation, logic 234 and switch 236 enable the provision of power to access circuitry 260 only when first control value equals the default value, and the power mode signal equals a predefined enable value. Thus, the provision of power is disabled if either the first control value is not the default value (e.g., equal to the first predefined power down value) or the power mode signal is not the equal to the enable value (e.g., equal to a predefined disable value). While FIG. 2B shows power control circuitry 220 controlling power to access circuitry 260 with logic 234 and switch 236, in other implementations other arrangements and configurations of control circuitry are used to enable and disable power to the access circuitry 260 in accordance with the power mode signal and first control value.

According to some embodiments power control circuitry 220 controls power to memory array 250 in accordance with the second control value stored in registers 224 via memory array power line 228. Power control circuitry 220 provides power from regulated power source 232 to memory array 250 when the second value is equal to a second predefined default value. Power control circuitry 220 disables the provision of power from regulated power source 232 to memory array 250 when the second value is equal to a second predefined power down value. The second predefined power down value is distinct from the second predefined default value. In some embodiments, power control circuitry 220 provides a first level of power from regulated power source 232 to memory array 250 when the second value is equal to a second predefined default value and provides a second level of power from regulated power source 232 to memory array 250 when the second value is equal to a second predefined power down value. While FIG. 2B shows power control circuitry 220 controlling power to memory array 250 with switch 238, other arrangements and configurations may be used to enable and disable power to the memory array 250 in accordance with the second value stored in control registers 224.

Powering down access circuitry 260 or memory array 250 of a defective memory element reduces power waste, and ensures that the defective portion of the multi-element device 110 does not interfere with communication between the host device and the other, non-defective memory elements. In some embodiments, host device 102 includes logic to re-map system memory space around a defective memory element (a die or core). Powering down access circuitry 260 or memory array 250 of a memory element not in use reduces power waste.

In some embodiments, not shown in the Figures, sideband signals (e.g., one or more of sideband data, timing signals, power mode signals) are multiplexed with data and/or command signals on the command and data bus 130. In these embodiments sideband bus 140, or one or more of the sideband data lines 146, power mode signal lines 142 and timing signal lines 144 are not needed. Instead, a multiplexer or other circuitry couples sideband terminals 202-204 to respective signal lines (e.g., a subset of the signal lines) of the data and command signal bus 130. In this way the functionality of the sideband signals is carried over the command and data bus 130 instead of a separate sideband bus 140.

Figure 3A:
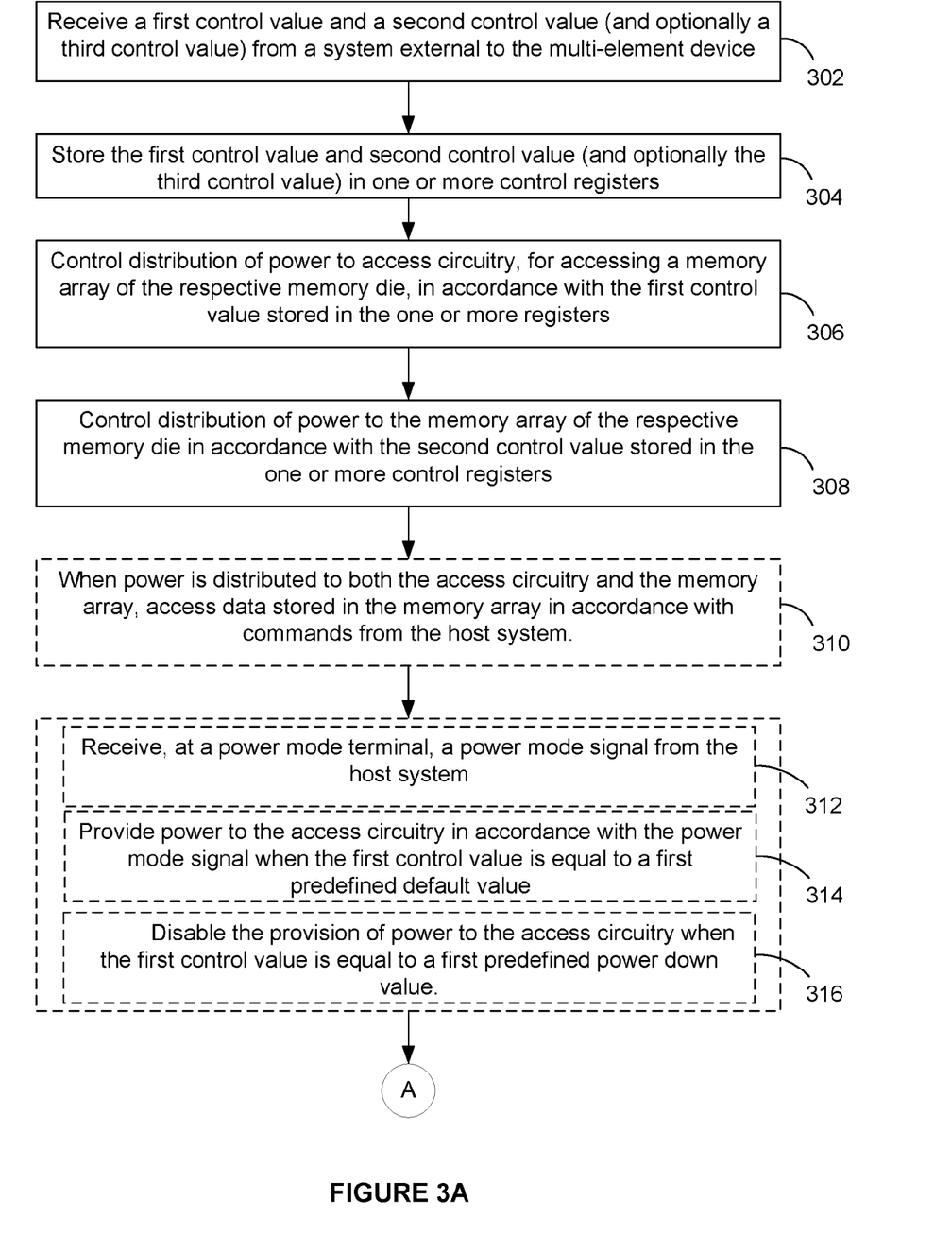
FIGS. 3A and 3B depict a flow diagram illustrating a method of controlling the distribution of power within a memory element in a multi-element stack, in accordance with some embodiments.
Figure 3B:
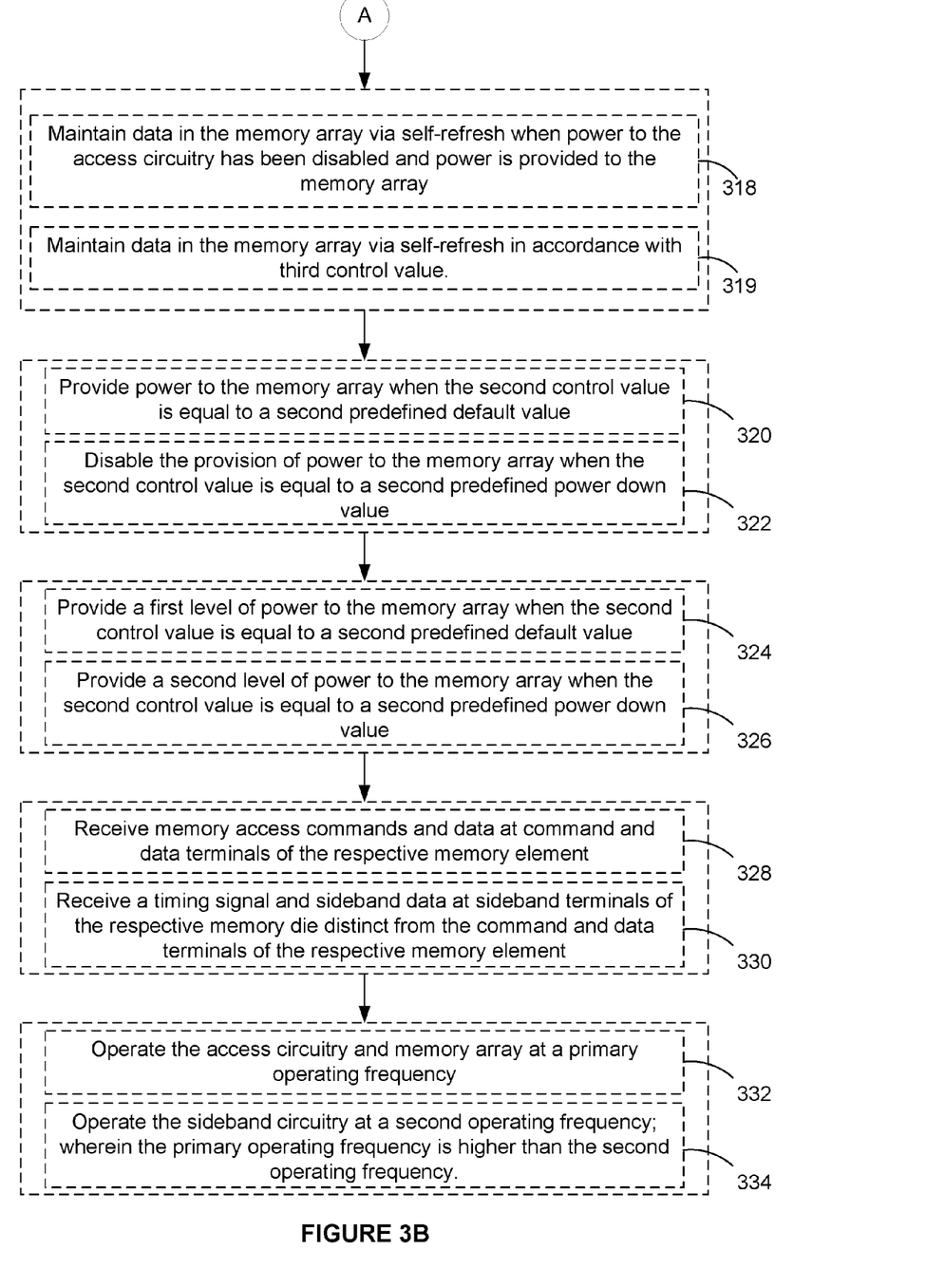

FIGS. 3A and 3B depict a flow diagram of a method of distributing power within a multi-element stack, in accordance with some embodiments. Optional operations are indicated by dashed lines (e.g., boxes with dashed-line borders).

As shown in FIG. 3A, in accordance with some embodiments, a memory element in a multi-element device (e.g., memory element 112-1 of device 110, FIG. 1) receives 302 a first control value and a second control value from a host system (e.g., host device 102). Optionally, a third control value is also received from the host system. The first control value and second control value, and optionally the third control value, are stored 304 in one or more control registers 224. In some implementations, sideband circuitry 210 stores the received control values (e.g., the first control value and second control value, and optionally the third control value) in control registers 224. Control registers 224 reside in power control circuitry 220, or elsewhere in multi-element device 110, as described above. Distribution of power to access circuitry 260 is controlled 306, at least in part, in accordance with the first control value stored in the one or more control registers. For example, power control circuitry 220 controls distribution of power to access circuitry 260 in accordance with the first control value stored in control registers 224. As explained below, in some implementations, power distribution to access circuitry 260 is controlled by a combination of the first control value and a power mode signal received from host device 102. For example, when the first control value is equal to a first predefined default value, a power mode signal received from host device 102 controls whether power is provided to access circuitry 260. Distribution of power to memory array 250 is controlled 308 in accordance with the second control value stored in the one or more control registers. For example, power control circuitry 220 controls distribution of power to memory array 250 in accordance with the second control value stored in control registers 224.

In accordance with some embodiments, when power is distributed to both access circuitry 260 and memory array 250, data in memory array 250 is accessed 310 in accordance with commands from host device 102.

In accordance with some embodiments, a power mode signal 142 is received 312, at a power mode terminal 202, from host device 102 (e.g., sideband circuitry 210 receives power mode signal 142 at power mode terminal 202). When the first control value is equal to a first predefined default value, power is provided 314 to access circuitry 260 in accordance with power mode signal 142 (e.g., power control circuitry 220 provides power from the regulated power source 232 to access circuitry 260.) Provision of power to access circuitry 260 is disabled 316 when the first control value is equal to a first predefined power down value (e.g., power control circuitry 220 disables the provision of power to access circuitry 260).

In some embodiments, when power to access circuitry 260 is disabled and power is provided to memory array 250, the data in memory array 250 is maintained via self-refresh 318 (FIG. 3B). Thus, self-refresh (if enabled) continues to function even when access circuitry 260 is disabled 316. In this way, data stored in memory array 250 is preserved even when power usage is reduced by disabling power distribution to access circuitry 260.

Alternatively, operation of the self-refresh circuitry 240 in a respective memory element 112 is enabled or disabled 119 in accordance the third control value stored in the one or more control registers (see operations 302, 304).

According to some embodiments, power is provided 320 to memory array 250 when the second control value is equal to a second predefined default value 320. Provision of power to memory array 250 is disabled 322 when the second control value is equal to a second predefined power down value. For example, power control circuitry 220 enables and disables the provision of power from regulated power source 232 to memory array 250 in accordance with the second control value. According to some embodiments, a first level of power is provided 326 to memory array 250 when the second control value is equal to a second predefined default value 324 and a second level of power is provided 326 to memory array 250 when the second control value is equal to a second predefined power down value.

According to some embodiments, memory access commands and data are received 328 at command 205 and data terminals 206 of the respective memory element 112 (e.g., access circuitry 260 receives memory access commands and data). Timing signals and sideband data are received 330 at timing signal terminals 203 and sideband data terminals 204, respectively, of the respective memory element 112, which are distinct from the command 205 and data terminals 206 of the respective memory element 112. For example, sideband circuitry 210 receives timing signals and sideband data at timing signal terminals 203 and sideband data terminals 204. In some embodiments, the sideband data received by sideband circuit 210 includes control values (e.g., the first and second control values). Sideband circuit 210, upon receiving the control values, stores those values in control registers 224. In some implementations, the timing signals are clock signals or strobe signals.

According to some embodiments, access circuitry 260 is operated 332 at a primary operating frequency, while the sideband circuitry 210 is operated 334 at a second operating frequency, which is independent of the primary operating frequency. In some embodiments, the second operating frequency is lower than the primary operating frequency. It is noted that operating sideband circuitry 210 at a second operating frequency which is lower than the primary operating frequency will typically result in more reliable data transmissions and fewer data transmission errors than would be the case if the sideband circuitry were to be operated at the higher primary operating frequency. In addition, operating sideband circuitry 210 at a lower frequency than the primary operating frequency reduces power usage.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings.

What is claimed is:

1. A multi-element device, comprising:
   a plurality of memory elements, comprising a plurality of dynamic random access memory (DRAM) die arranged in a stack, each DRAM die in the stack including:
      one or more memory cores; and
      access circuitry coupled to the one or more memory cores of the DRAM die, the access circuitry configured to enable access to the one or more memory cores of the DRAM die in accordance with received memory access commands;
   wherein each DRAM die has controllable power modes, including a first mode in which the access circuitry of the DRAM die is powered down, and a second mode in which power is provided to the access circuitry of the DRAM die; and
   power mode signal lines to convey power mode information to each DRAM die of the plurality of DRAM die;
   wherein each DRAM die in the stack includes:

power control circuitry, including a first control register storing a first control value, the power control circuitry to control distribution of power to the access circuitry in accordance with the first control value stored in the control register; and sideband circuitry configured to enable a host system external to the multi-element device to set at least the first control value in the first control register in the power control circuitry.

2. The multi-element device of claim 1, wherein the access circuitry and the one or more memory cores of each respective DRAM die operate at a primary operating frequency, and the sideband circuitry of each respective RAM die operates at a second operating frequency that is less than the primary operating frequency.

3. The multi-element device of claim 2, each memory element further comprising:
a power mode terminal for receiving a power mode signal from the host system.

4. The multi-element device of claim 1, wherein the power mode signal lines include a distinct power mode signal line for each memory element of the plurality of memory elements, the distinct power mode signal line for a respective memory element conveying power mode information to the respective memory element.

5. The multi-element device of claim 1, each DRAM die further comprising:
a power mode terminal for receiving a power mode signal from the host system; and
sideband terminals, coupled to the sideband circuitry, the sideband terminals for connection to sideband signal lines.

6. The multi-element device of claim 1, wherein:
the power control circuitry of a respective DRAM die includes a second control register storing a second control value, the power control circuitry to control distribution of power to the one or more memory cores in accordance with the second control value stored in the second control register; and
the sideband circuitry of the respective DRAM die is further configured to enable the host system external to the multi-element device to set the second control value in the second control register.

7. The multi-element device of claim 6, each DRAM die further comprising:
a power mode terminal for receiving a power mode signal from the host system; and
sideband terminals, coupled to the sideband circuitry, the sideband terminals for connection to sideband signal lines.

8. The multi-element device of claim 7, wherein each DRAM die further comprises:
data line terminals and command terminals for connection to data and command signal lines, respectively, wherein the data line terminals and command terminals are distinct from the sideband terminals, and the data and command signal lines are distinct from the sideband signal lines.

9. The multi-element device of claim 7, wherein the sideband terminals include a timing signal terminal to receive a timing signal.

10. The multi-element device of claim 1, further including, in each DRAM die of the plurality of DRAM die, self-refresh circuitry for self-refreshing data stored in the one or more memory cores of the DRAM die, wherein the self-refresh circuitry is for self-refreshing data stored in the one or more memory cores of the DRAM die when the access circuitry of the DRAM die is powered down and provision of power to the one or more memory cores of the DRAM die is enabled.

11. A method of operating a multi-element device having a plurality of memory elements, comprising a plurality of dynamic random access memory (DRAM) die arranged in a stack, each DRAM die in the stack including:
one or more memory cores; and
access circuitry coupled to the one or more memory cores of the DRAM die, the access circuitry configured to enable access to the one or more memory cores of the DRAM die in accordance with received memory access commands;
the method comprising:
for each individual DRAM die of the plurality of DRAM die, setting a power mode, wherein each DRAM die has controllable power modes, separately controllable from power modes of other DRAM die in the plurality of DRAM die, the controllable power modes including a first mode in which the access circuitry of the DRAM die is powered down, and a second mode in which power is provided to the access circuitry of the DRAM die; and
receiving power mode information for each DRAM die of the plurality of DRAM die via power mode signal lines; and
when a respective DRAM die of the plurality of DRAM die is in the second mode, enabling access to the one or more memory cores of the respective DRAM die in accordance with received memory access commands;
wherein each DRAM die includes:
power control circuitry, including a first control register storing a first control value, the power control circuitry to control distribution of power to the access circuitry in accordance with the first control value stored in the control register; and
sideband circuitry configured to enable a host system external to the multi-element device to set at least the first control value in the first control register in the power control circuitry.

12. The method of claim 11, including:
operating the access circuitry and the one or more memory cores of each respective DRAM die at a primary operating frequency, and operating the sideband circuitry of each respective DRAM die at a second operating frequency that is less than the primary operating frequency.

13. The method of claim 11, further comprising, in the respective DRAM die:
receiving, at a power mode terminal of the respective DRAM die, a power mode signal from the host system;
providing power to the access circuitry of the respective DRAM die in accordance with the power mode signal when the first control value is equal to a first predefined default value; and
disabling the provision of power to the access circuitry when the first control value is equal to a first predefined power down value.

14. The method of claim 11, including:
in a respective DRAM die in the stack:
receiving, from the host system, the first control value and a second control value;
storing, in the first control register and a second control register of the power control circuitry of the respective DRAM die, the first control value and the second control value, respectively;

controlling distribution of power to the access circuitry of the respective DRAM die in accordance with the first control value stored in the first control register; and controlling distribution of power to the one or more memory cores of the respective DRAM die in accordance with the second control value stored in the second control register.

15. The method of claim 14, further comprising, at the respective DRAM die:

when power is distributed to both the access circuitry and the one or more memory cores of the respective DRAM die, accessing data stored in the one or more memory cores of the respective DRAM die in accordance with commands from the host system.

16. The method of claim 14, further comprising, at the respective DRAM die:

self-refreshing data stored in the one or more memory cores of the respective DRAM die when:

the provision of power to the access circuitry is disabled in accordance with the first control value stored in the first control register; and the provision of power to the one or more memory cores of the respective DRAM die is enabled in accordance with the second control value stored in the second control register.

17. The method of claim 14, further comprising, at the respective DRAM die:

providing a first level of power to the one or more memory cores of the respective DRAM die when the second control value stored in the second control register is equal to a second predefined default value and providing a second level of power to the one or more memory cores of the respective DRAM die when the second control value stored in the second control register is equal to a second predefined power down value.

* * * * *